(12) United States Patent
Yu

(10) Patent No.: US 7,398,453 B2
(45) Date of Patent: Jul. 8, 2008

(54) METHOD AND APPARATUS FOR A LOW-DENSITY PARITY-CHECK DECODER

(75) Inventor: Xiaoyong Yu, Grayslake, IL (US)

(73) Assignee: Motorola, Inc., Schaumburg, IL (US)

( * ) Notice: Subject to any disclaimer, the term of this patent is extended or adjusted under 35 U.S.C. 154(b) by 464 days.

(21) Appl. No.: 11/242,506

(22) Filed: Oct. 3, 2005

(65) Prior Publication Data

US 2007/0089024 A1 Apr. 19, 2007

(51) Int. Cl.
H03M 13/45 (2006.01)

(52) U.S. Cl. .................................. 714/778; 714/780

(58) Field of Classification Search ................ 714/778, 714/780
See application file for complete search history.

(56) References Cited

U.S. PATENT DOCUMENTS

| | | | |
|---|---|---|---|
| 6,594,318 B1 | 7/2003 | Sindhushayana | |
| 6,757,337 B2 * | 6/2004 | Zhuang et al. | 375/267 |
| 6,829,308 B2 * | 12/2004 | Eroz et al. | 375/271 |
| 6,895,547 B2 * | 5/2005 | Eleftheriou et al. | 714/801 |
| 6,954,832 B2 * | 10/2005 | Suzuki et al. | 711/157 |
| 7,000,167 B2 * | 2/2006 | Coker et al. | 714/752 |
| 7,023,936 B2 * | 4/2006 | Sutskover et al. | 375/341 |
| 7,149,953 B2 * | 12/2006 | Cameron et al. | 714/794 |

OTHER PUBLICATIONS

Chung, Sae-Young et al.: "Analysis of Sum-Product Decoding of Low-Density Parity-Check Codes Using a Gaussian Approximation", IEEE Transactions on Information Theory, vol. 47, No. 2, Feb. 2001, pp. 657-670.

IEEE 802.20 Working Group on Mobile Broadband Wireless Access, <http://grouper.ieee.org/groups/802./20;>, Initial Contribution on a System Meeting MBWA Characteristics, IEEE C802.20-03/16, Mar. 6, 2003, pp. 1-49.

Gallager, R.G.: Low-Density Parity-Check Codes, IRE Transactions on Information Theory, 1962, pp. 21-28.

Intel LDPC Code Technical Description, Eric Jacobsen, Apr. 11, 2004, VO.2.

Kschischang, Frank R. et al.: "Iterative Decoding of Compound Codes by Probability Propagation in Graphical Models", IEEE Journal on Selected Areas in Communications, vol. 16, No. 2, Feb. 1998, pp. 219-230.

Jacobsen, Eric: LDPC FEC for IEEE 802.11n Applications, doc.: IEEE 802.11-03/0865r1, Intel Labs Communications Technology Laboratory, Nov. 10, 2003, slides 1-35.

(Continued)

Primary Examiner—Stephen M. Baker

(57) ABSTRACT

A low-density parity-check (LDPC) decoder (304) has a memory (308), and a processor (306). The processor is programmed to initialize (202) the LDPC decoder, calculate (204) a probability for each check node, calculate (206) a probability for each bit node, calculate soft decisions, update the bit nodes according to the calculated soft decisions, calculate (208) values from the calculated soft decisions, perform (210) a parity check on the calculated values, update (218) log-likelihood ratios (LLRs) if a bit error is detected in the calculated values, update the bit nodes according to the updated LLRs, and repeat the foregoing post initialization steps.

20 Claims, 8 Drawing Sheets

OTHER PUBLICATIONS

Richardson, Thomas J. et al.: "The Capacity of Low-Density Parity-Check Codes Under Message-Passing Decoding", IEEE Transaction on Information Theory, vol. 4, No. 2, Feb. 2001, pp. 599-618.

Richardson, Thomas J. et al.: "Design of Capacity-Approaching Irregular Low Density Parity-Check Codes", IEEE Transactions on Information Theory, vol. 47, No. 2, Feb. 2001, pp. 619-637.

Richardson, Thomas J. et al.: "Efficient Encoding of Low-Density Parity-Check Codes", IEEE Transactions on Information Theory, vol. 47, No. 2, Feb. 2001, pp. 638-656.

Mackay, David J. C.: "Good Error-Correcting Codes Based on Very Sparse Matrices", IEEE Transactions on Information Theory, vol. 45, No. 2, Mar. 1999, pp. 399-431.

* cited by examiner

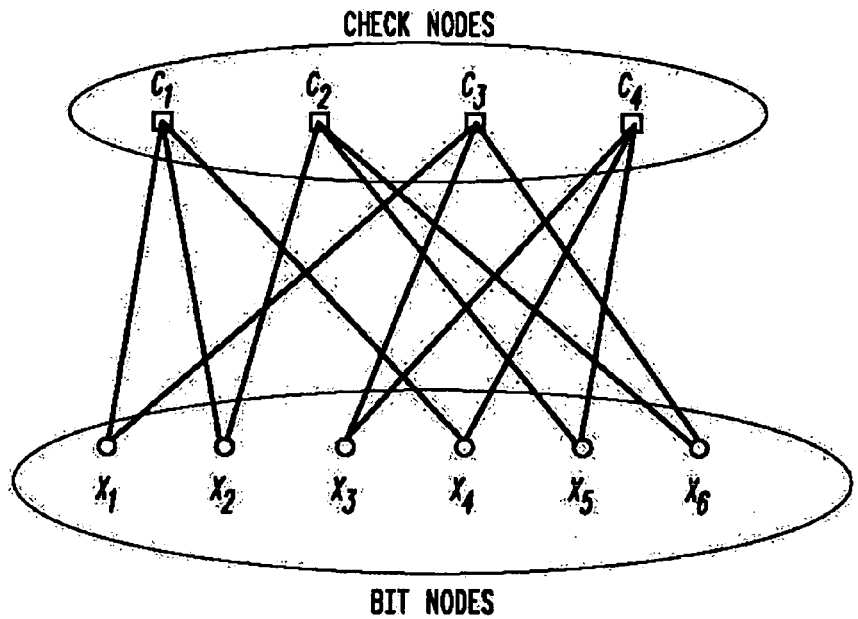
FIG. 1 —PRIOR ART—
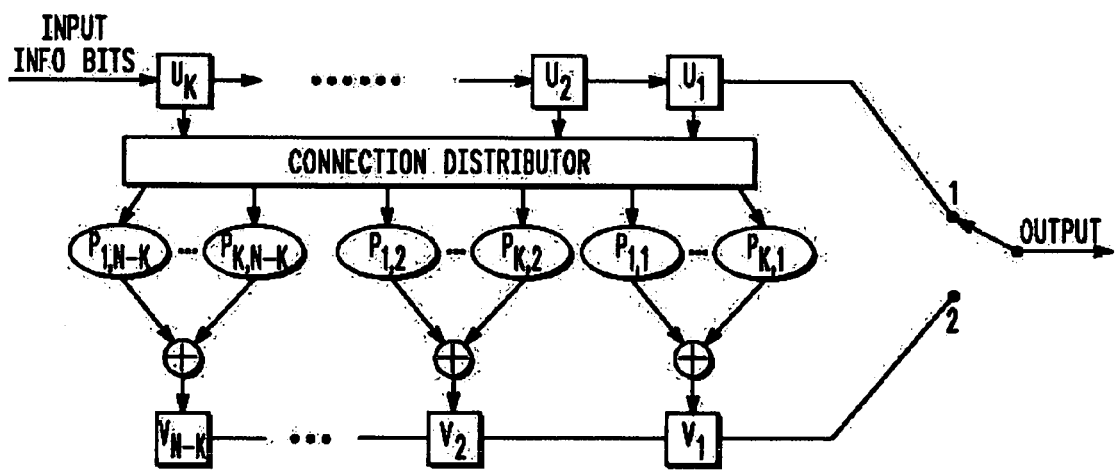
FIG. 2 —PRIOR ART—

METHOD AND APPARATUS FOR A LOW-DENSITY PARITY-CHECK DECODER

FIELD OF THE INVENTION

This invention relates generally to low-density parity-check (LDPCs) decoders, and more specifically to a method and apparatus for an LDPC decoder.

BACKGROUND

LDPC codes are linear block codes. The codeword space and the encoding procedure of LDPC codes are specified by a generator matrix G, given by:

$$x = uG$$

where G is a K×N matrix with full-row rank, u is a 1×K vector representing information bits and x is a 1×N vector for the codeword. Usually, the generator matrix can be written as follows:

$$G = [I_{K \times K} \, P_{K \times (N-K)}]$$

Alternatively, a linear block code can be equivalently specified by a parity-check matrix H, given by $$Hx^t = 0$$

for any codeword x, where H is an M×N matrix, and M=(N−K). Because $Hx^t=0$ implies $HG^t=0$, if a parity-check matrix H is known, so is the generator matrix G, and vice-versa. Matrix G generally describes an encoder, while H is usually used to check if a given binary vector x is a valid codeword in the decoder.

The parity-check matrix H for an LDPC code is sparse, which means a small portion of the entries are one while others are zeros, and the one's positions are determined in a random fashion. These randomly selected positions of one's are critical to the performance of an associated LDPC code, which is analogous to an interleaver of turbo codes.

LDPC code can be represented by a "bipartite" or Tanner graph in which the nodes can be separated into two groups of check nodes and bit nodes with connections allowed only between nodes in differing groups. For example, an LDPC code can be specified by a parity-check matrix, which defines a set of parity-check equations for codeword x as follows:

$$H = \begin{bmatrix} 1 & 1 & 0 & 1 & 0 & 0 \\ 0 & 1 & 0 & 0 & 1 & 1 \\ 1 & 0 & 1 & 0 & 0 & 1 \\ 0 & 0 & 1 & 1 & 1 & 0 \end{bmatrix} \text{ and } \begin{cases} x_1 + x_2 + x_4 = 0 \\ x_2 + x_5 + x_6 = 0 \\ x_1 + x_3 + x_6 = 0 \\ x_3 + x_4 + x_5 = 0 \end{cases}$$

For a binary LDPC code, all multiplications and additions are defined for binary operations. Consequently, the LDPC code, or more specifically, the parity-check equations can be represented by the Tanner graph of FIG. 1. Each bit node corresponds to a bit in the codeword x, and each check node represents a parity-check equation that is specified by a row of matrix H. Therefore, the bipartite graph for an LDPC code with an M×N parity-check matrix H contains M check nodes and N bit nodes. An edge between a check node and a bit node exists if and only if the bit participates in the parity-check equation associated with the check node.

An LDPC encoder with a code rate of K/N can be implemented as illustrated in FIG. 2. The K information bits are shifted in and stored in K registers. N-K parity bits are calculated according to the sub-matrix P of generator matrix G. The output switch is at position 1 first to serially shift out K information bits, then the switch is connected to position 2 to serially shift out N-K parity check bits.

The LDPC decoder is based on an iterative message-passing, or a "turbo-like" belief propagation. A sum-product algorithm is a well-known method for LDPC decoding and can be implemented in a logarithm domain (see method depicted in FIG. 3). To describe the sum-product algorithm, the following notations can be used: M(b) denoting the set of check nodes that are connected to bit node b, i.e., "1"s positions in the $b^{th}$ column of the parity-check matrix H, and B(m) denoting the set of bit nodes that connect to check node m, i.e., "1"s positions in the $m^{th}$ row of the parity-check matrix. B(m)\b represents the set B(m) with the bit node b excluded. Similarly, M(b)\m represents the set M(b) with the check node m excluded. Variables $q_{b \to m}^0$ and $q_{b \to m}^1$ denote the probability information that bit node b sends to check node m, indicating $P(x_b=0)$ and $P(x_b=1)$, respectively. Variables $r_{m \to b}^0$ and $r^{m \to b1}$ denote the probability information that the $m^{th}$ check node gathers for the $b^{th}$ bit with a value of 0 and 1, respectively.

Roughly speaking, $r_{m \to b}^0$ (or $r_{m \to b}^1$) is the likelihood information for $x_b=0$ (or $x_b=1$) from the $m^{th}$ parity-check equation, when the probabilities for other bits are designated by the $q_{b \to m}$'s. Therefore, $r_{m \to b}^0$ can be considered as the "extrinsic" information for the $b^{th}$ bit from the $m^{th}$ check node. The soft decision or log-likelihood ratio of a bit is calculated by adding a priori probability information to the extrinsic information from all check nodes that connect to it.

In the logarithm domain, all probability information is equivalently characterized by the log-likelihood ratios (LLRs) as follows:

$$L(r_{m \to b}) = \log \frac{r_{m \to b}^1}{r_{m \to b}^0}$$

$$L(q_{b \to m}) = \log \frac{q_{b \to m}^1}{q_{b \to m}^0}$$

$$L(p_b) = \log \frac{p_b^1}{p_b^0}$$

$$L(q_b) = \log \frac{q_b^1}{q_b^0}$$

where $q_b^0$ (or $q_b^1$) is an posteriori probability of $x_b=0$ (or $x_b=1$) and $p_b^0$ (or $p_b^1$) is an priori probability of $x_b=0$ (or $x_b=1$) of received information from a channel. The LDPC decoding procedure described above is summarized in the flowchart in FIG. 3.

In case of high order QAM modulations, each QAM symbol contains multiple code bits while the input to the LDPC decoder is a sequence of LLRs for each bit. Therefore, the received QAM soft symbols must be converted into LLRs for each bit. Assuming the received QAM soft symbol is represented as $r=r_I+jr_Q=s+n$, where $s=s_I+js_Q$ is its associated QAM hard symbol and n is complex noise with variance $2\sigma^2$. The LLR for bit k can be approximated by using a dual-max method as follows:

$$LLR(b_k) = \ln\frac{LL(b_k = 1)}{LL(b_k = -1)} \quad (1)$$

$$= \ln\frac{\sum_{b_k \in S_1} \exp\left[-\frac{(r_I - s_I)^2}{2\sigma^2} - \frac{(r_Q - s_Q)^2}{2\sigma^2}\right]}{\sum_{b_k \in S_{-1}} \exp\left[-\frac{(r_I - s_I)^2}{2\sigma^2} - \frac{(r_Q - s_Q)^2}{2\sigma^2}\right]}$$

$$\approx K\left[\max_{b_k \in S_1}\{-(r_I - s_I)^2 - (r_Q - s_Q)^2\} - \max_{b_k \in S_{-1}}\{-(r_I - s_I)^2 - (r_Q - s_Q)^2\}\right]$$

$$= K\left[\max_{b_k \in S_1}\{2r_I s_I - s_I^2 + 2r_Q s_Q - s_Q^2\} - \max_{b_k \in S_{-1}}\{2r_I s_I - s_I^2 + 2r_Q s_Q - s_Q^2\}\right]$$

where K is the LLR scalar that depends on a noise variance, where $S_1$ and $S_{-1}$ are sets of $(s_I s_Q)$ corresponding to $b_k=1$ and $-1$, respectively. In the present case $b_k=1$ and $b_k=-1$ are equivalent to $x_{b_k}=0$ $x_{b_k}=1$, respectively. In the case of 16QAM (using a bit-to-symbol mapping rule $s_I=2b_k+b_{k+1}$ and $s_Q=2b_{k+2}+b_{k+3}$ as an example, where each bit takes a value of 1 or $-1$), the following equations apply:

$s_I=-3, -1, 1, 3$ for $(b_k, b_{k+1})=(-1,-1), (-1,1), (1,-1), (1,1)$ $s_Q=-3, -1, 1, 3$ for $(b_{k+2}, b_{k+3})=(-1,-1), (-1,1), (1,-1), (1,1)$ The log-likelihood function of $b_k=1$, $LL(b_k=1)$, is approximately the largest quantity among eight values determined by $\{2r_I s_I - s_I^2 + 2r_Q s_Q - s_Q^2\}$ corresponding to $s_I>0$. Similarly, log-likelihood function of $b_k=-1$ is approximately the largest one among eight quantities of $\{2r_I s_I - s_I^2 + 2r_Q s_Q - s_Q^2\}$ evaluated at eight symbols corresponding to $s_I \leq 0$.

The foregoing description of an LDPC codes can be applied to FEC (Forward Error Correction) applications in many wireless air interfaces such as WiMax (IEEE802.16e), advanced WiFi (IEEE802.11n) and Mobile Broadband Wireless Access (IEEE802.20). Typically, air interfaces such as these utilize Orthogonal Frequency Division Modulation (OFDM) where each tone carries QPSK, 16QAM or 64QAM symbols. During the demodulation process, the soft QAM symbols are converted into LLRs, which feed the LDPC decoder described above. The above-described dual-max method, however, serves to approximate LLR values of each bit. Such approximation can therefore lead to performance degradation.

A need therefore arises for a method and apparatus that improves LDPC decoding.

SUMMARY OF THE INVENTION

Embodiments in accordance with the invention provide a system and method for an LDPC decoder.

In a first embodiment of the present invention, a low-density parity-check (LDPC) decoder has a memory, and a processor. The processor is programmed to initialize the LDPC decoder, calculate a probability for each check node, calculate a probability for each bit node, calculate soft decisions, update the bit nodes according to the calculated soft decisions, calculate values from the calculated soft decisions, perform a parity check on the calculated values, update log-likelihood ratios (LLRs) if a bit error is detected in the calculated values, update the bit nodes according to the updated LLRs, and repeat the foregoing post initialization steps.

In a second embodiment of the present invention, a computer-readable storage medium has computer instructions for initializing a plurality of bit nodes with log-likelihood ratios (LLRs), initializing a plurality of check nodes to a predetermined setting, associating each bit node to one or more corresponding check nodes, associating each check node to one or more corresponding bit nodes, calculating a probability for each check node, calculating a probability for each bit node, calculating soft decisions, updating the bit nodes according to the calculated soft decisions, calculating values according to a sign of the calculated soft decisions, performing a parity check on the calculated values, updating the LLRs according to initial and intermediate LLRs adjusted by first and second factors if a bit error is detected in the calculated values, updating the bit nodes according to the updated LLRs, and repeating the foregoing post initialization steps.

In a third embodiment of the present invention, a base station has a transceiver, a memory, and a processor. The processor is programmed to intercept messages from a selective call radio, and decode said messages by initializing a plurality of bit nodes with log-likelihood ratios (LLRs), initializing a plurality of check nodes to a predetermined setting, associating each bit node to one or more corresponding check nodes, associating each check node to one or more corresponding bit nodes, calculating a probability for each check node, calculating a probability for each bit node, calculating soft decisions according to corresponding check nodes and previous soft decisions of the bit nodes, updating the bit nodes according to the calculated soft decisions, calculating values according to a sign of the calculated soft decisions, performing a parity check on the calculated values, updating the LLRs if a bit error is detected in the calculated values, updating the bit nodes according to the updated LLRs, and repeating the foregoing post initialization steps.

BRIEF DESCRIPTION OF THE DRAWINGS

FIG. 1 is a block diagram of a prior art Tanner graph for a low-density parity-check (LDPC) decoder.

FIG. 2 is a block diagram of a prior art LDPC encoder with a code rate of K/N.

DETAILED DESCRIPTION

Figure 3:
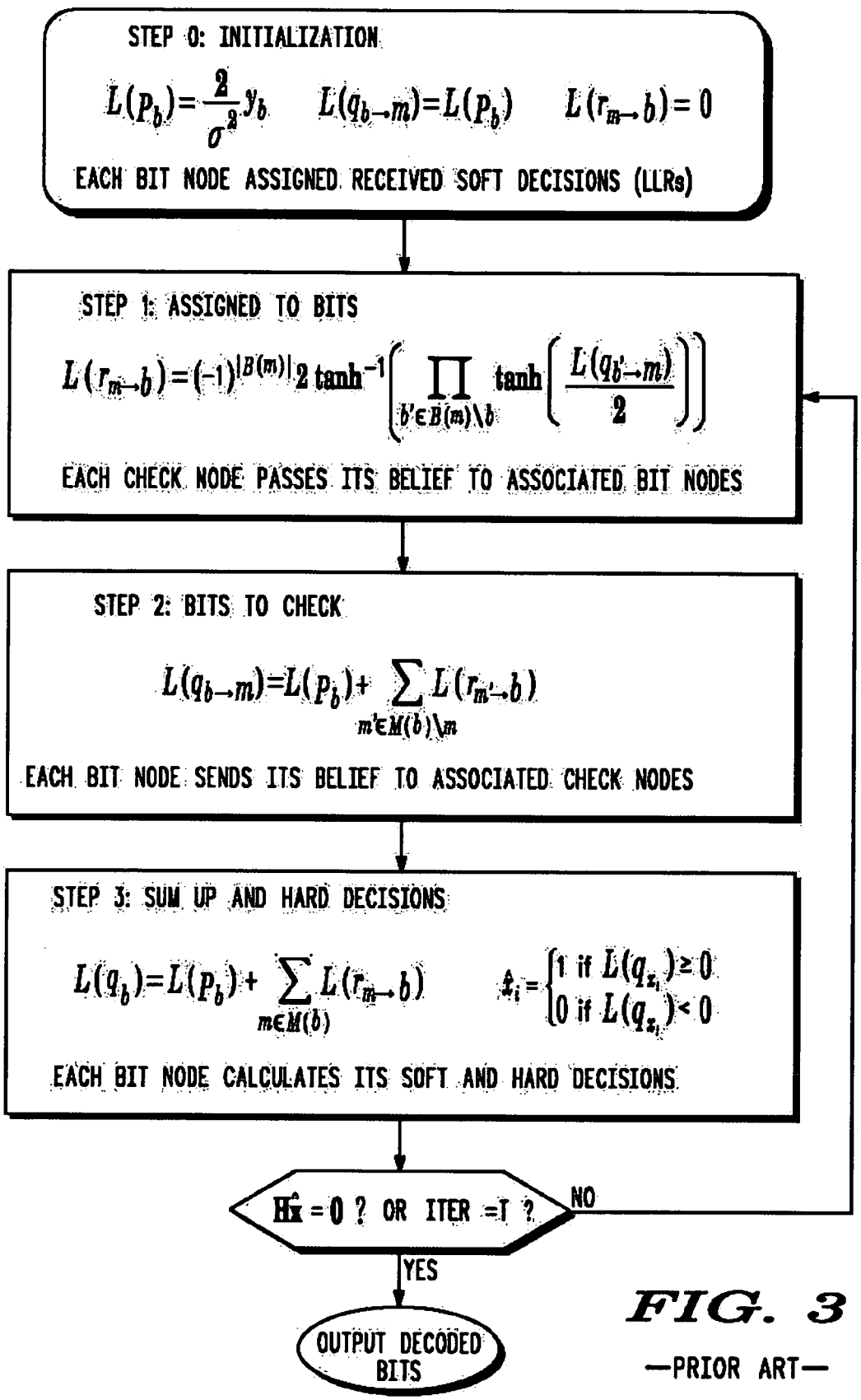
FIG. 3 depicts a flowchart of a method operating in a prior art LDPC decoder.
Figure 4:
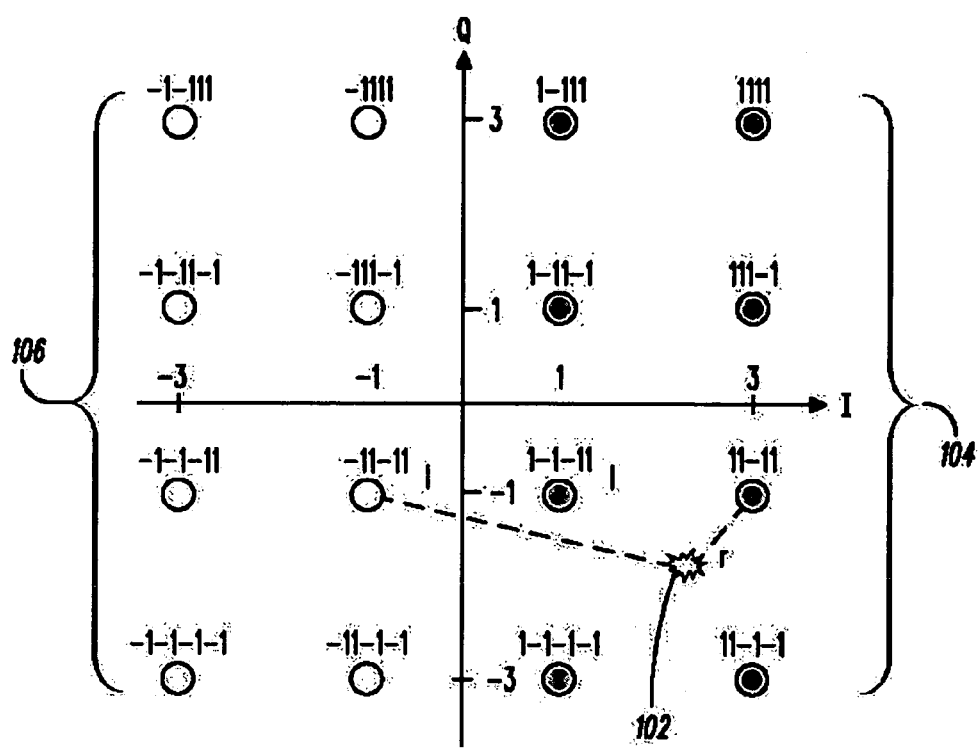
FIGS. 4-6 depict constellations of a 16QAM to illustrate a method for LLR calculation in accordance with an embodiment of the present invention.

The conventional dual-max method of equation (1) in the aforementioned prior art approximates an LLR bit by calculating all possible likelihoods and selecting the largest one. However, if additional information is available about which constellation points should be used to determine an LLR bit, an approximation is not necessary. FIG. 4 depicts a constellation integrating teachings of the present disclosure. In conventional dual-max calculations, to calculate the LLR of a first bit of a received soft symbol 102 depicted as a circle with rough edges in FIG. 4, a distance from point 102 to all gray points 104 is calculated to determine a point having a minimum distance to point 102, which in this example is point 11-11. A distance of point 102 is then calculated to all uncolored points 106 to determine a point having a minimum distance thereto, which in this illustration is point −11-11.

Figure 5:
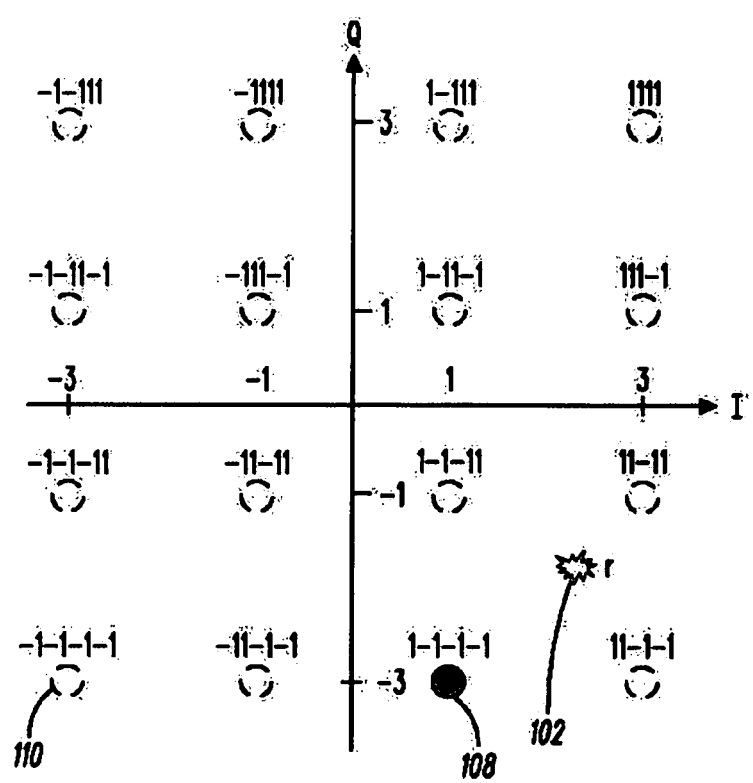

If additional information about bits 2, 3 and 4 are available, say $b_2=b_3=b_4=-1$, then only two constellation points (1-1-1-1) colored in gray in FIG 5 as point 108, and (−1-1-1-1) uncolored point 110 should be used for LLR calculation for the first bit $b_1$. That is, the LLR of bit $b_1$ is the difference between the distances of point 102 to point 108 (i.e., 1-1-1-1) and point 102 to point 110 (i.e., −1-1-1-1). These calculations are the true LLR of bit $b_1$ without approximation.

Unfortunately, the additional information about bits 2, 3 and 4 are generally not available before the information bits are decoded in a conventional decoder. However, in an LDPC decoder intermediate results can be used to update the decoder input such that the input to the decoder is approaching a true LLR for each bit. As described earlier, an LDPC decoder can calculate an LLR or a soft decision for each bit iteratively. The sign of the soft decision determines the value of an associated bit (1 or −1), while the magnitude of a soft decision indicates the confidence of the decoded bit. The larger the soft decision magnitude, the higher the confidence for the decoded bit.

Figure 6:
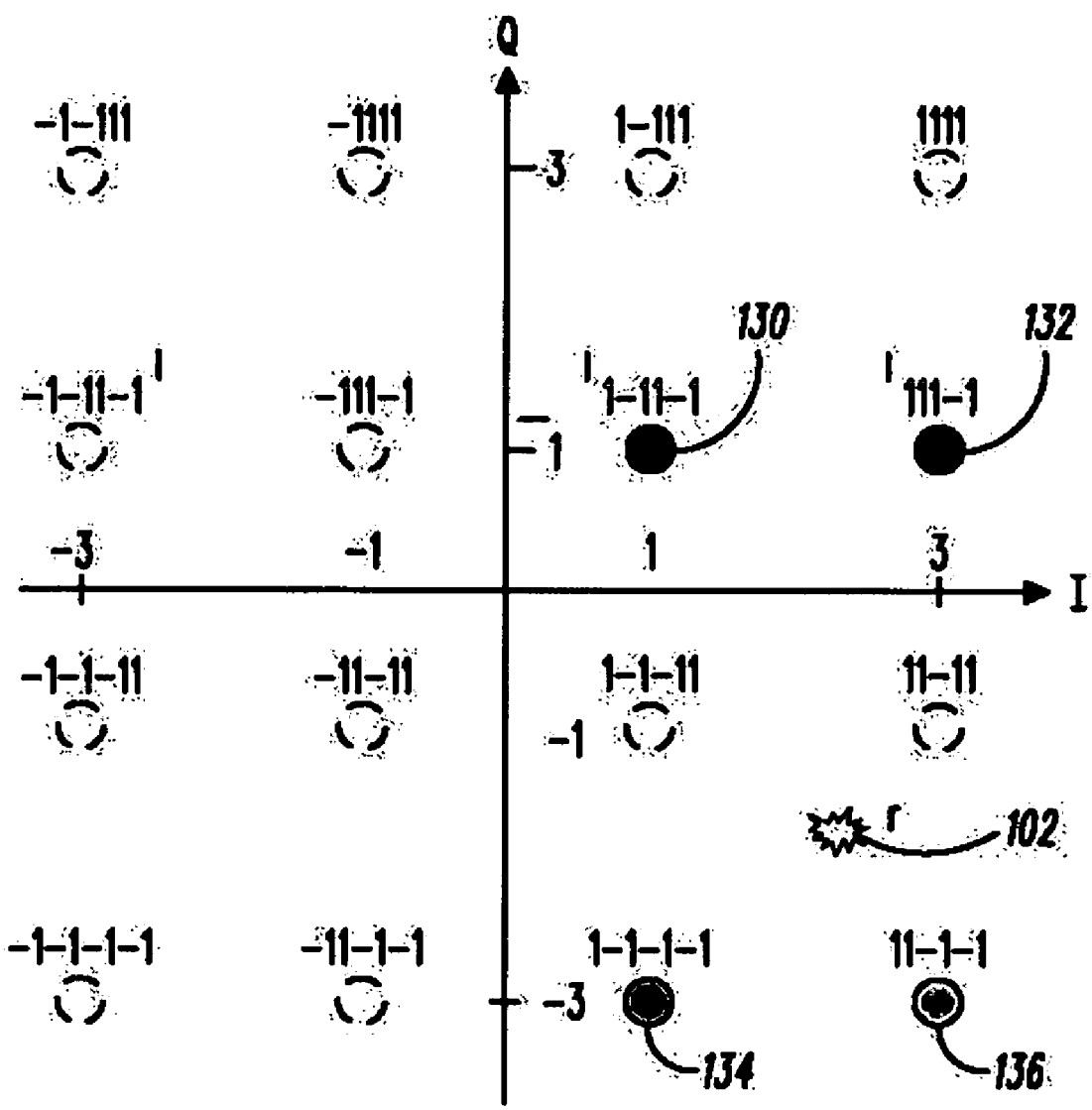

During the decoding iterations, an intermediate hard bit decision can be determined for the soft decision according to the following relationship:

$$\hat{b}_k = \begin{cases} 1 & \text{soft}(b_k) \geq M \\ -1 & \text{soft}(b_k) < -M \\ 0 & \text{Otherwise} \end{cases}$$

where M is a threshold for a hard bit decision that can be adaptively determined as a scaled average magnitude of intermediate soft decisions. From this relationship, it is apparent that the intermediate bit sequence is ternary instead of binary valued. A value of 0 indicates the hard decision for an associated bit is not available due to an insufficient confidence level. Based on the intermediate ternary bit sequence, the LLR bits can be updated. For example, when determining the LLR of bit 3, and knowing the intermediate hard decisions for bits 1, 2 and 4 are 1, 0, and −1, respectively, then four constellation points 130-136 can be used for the LLR calculation as illustrated in FIG. 6.

That is, the distances between received soft symbol 102 to points 130 and 132 (i.e., 1-11-1 and 111-1) can be calculated to determine the minimum distance, which in this illustration is the distance between point 102 and point 132, i.e., 111-1. Similarly, the distances between received soft symbol 102 to points 134 and 136 (i.e., 1-1-1-1 and 11-1-1) can be computed and the closest point selected, which in this illustration is the distance between point 102 and point 136, i.e., 11-1-1. The LLR of bit 3 is the difference between the two minimum distances calculated. For every non-zero hard decision in a group of bits associated with one QAM symbol, the number of points in the constellation used for calculating an LLR bit is scaled down by a factor of 2. Thus, a size of a set over which a distance minimization is calculated to update a portion of the LLR bits can be reduced by $2^N$ if N of the ternary values has a non-zero value. If all the ternary values have a non-zero value, a portion of the LLRs can be updated by subtraction without distance minimization. Alternatively, if all of the ternary values are zero, a full size of a set over which a distance minimization is calculated can be used to update a portion of the LLRs.

The conventional dual-max method is a special case where all hard bit decisions are zeros. The initial input to LDPC decoder in this case is determined by the dual-max method. After a few iterations when intermediate hard bit decisions are available, the input to LDPC decoder can be updated or fine-tuned.

It is also possible that an intermediate hard decision is incorrect even though the threshold M has been introduced to reduce a probability of error. Thus, the updated LLR bit can be determined as a combination of an initial LLR and a current LLR given by:

$$LLR_{updated} = \alpha \times LLR_{initial} + (1-\alpha) \times LLR_{intermediate}$$

where $LLR_{initial}$ and $LLR_{intermediate}$ are determined by dual-max techniques as described by the present invention, where $\alpha$ is a coefficient valued between 0 and 1 depending on the number of iterations and average magnitude of intermediate soft decisions.

Figure 7:
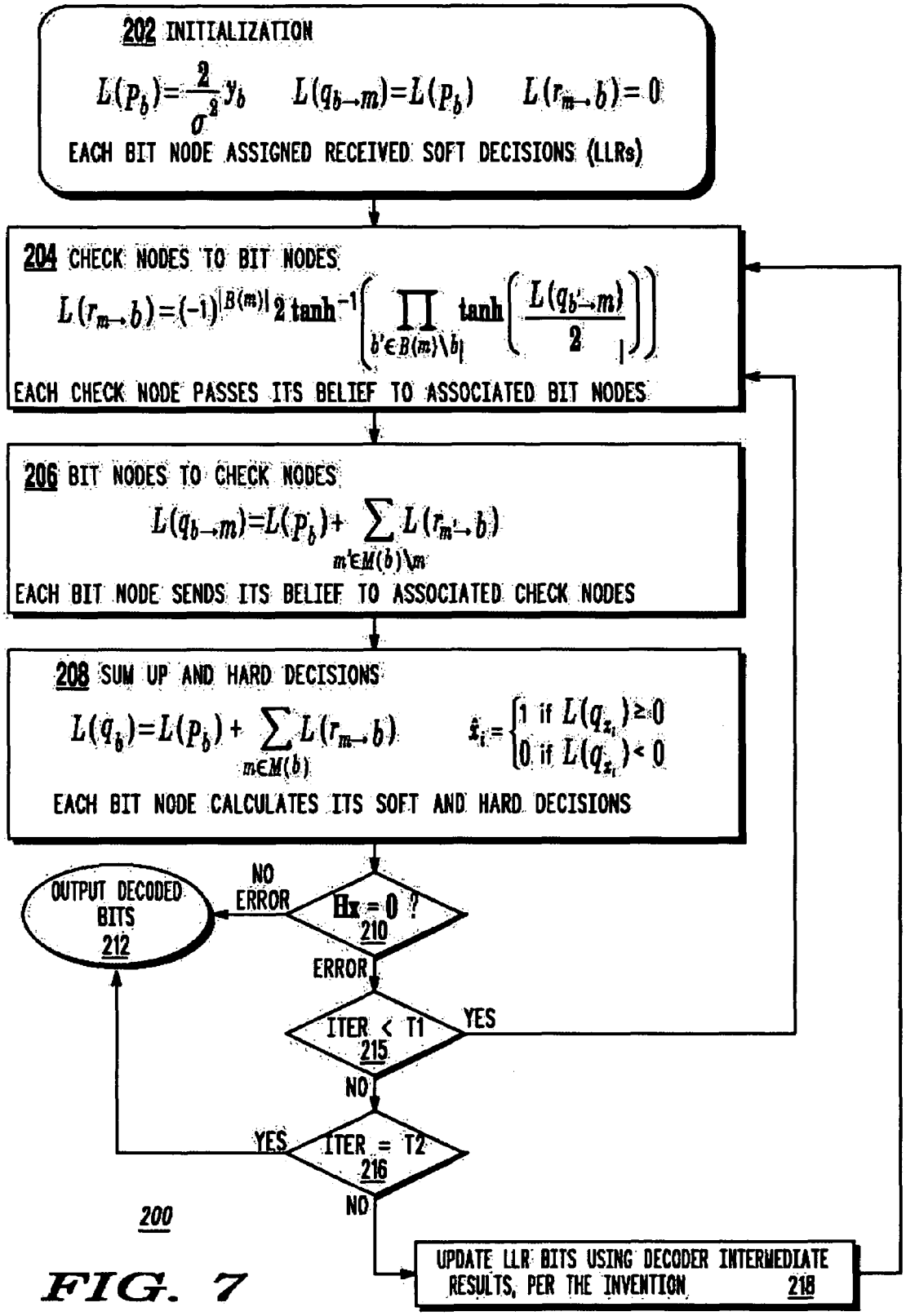
FIG. 7 depicts a flowchart of a method operating in an LDPC decoder in accordance with an embodiment of the present invention.

FIG. 7 depicts a flowchart of a method 200 operating in an LDPC decoder according to the present invention. Method 200 begins with step 202 where the LDPC decoder is initialized. This step can correspond to, for example, the step of initializing bit nodes with LLR bits, initializing check nodes to a predetermined setting, associating each bit node to corresponding check nodes, and vice-versa. In step 204, a probability is calculated according to the formula shown for each of the check nodes, the results of which are then passed as a belief to associated bit nodes. Similarly, in step 206, a probability is calculated according to the formula shown for each of the bit nodes, the results of which are then passed as beliefs to associated check nodes.

In step 208, soft and corresponding hard decisions are made on each bit node according to the formulas shown. In step 210, a parity check is performed on the bit values determined in step 208. If no error is detected, then the decoder ceases operation in step 212 and supplies the decoded bits to a targeted device (as will be described later in FIG. 14). If an error is detected, then the LDPC decoder continues to step 214 where it checks if the number of iterations of method 200 is less than a preset value T1. If so, then the LDPC decoder proceeds back to step 204 to repeat the foregoing operations. Otherwise, the LDPC decoder checks in step 216 if the number of iterations has reached a second preset value T2 (which is greater than T1). If not, then in step 218 the LLR bits are updated as described in the LLR update equation above and thereafter proceeds to step 204 to repeat the foregoing steps with a new set of LLR bits. If, on the other hand, T2 iterations have been performed, then the LDPC decoder proceeds to step 212 and ceases further processing.

It should be noted that if multiplication operations cost more than addition, the belief message from check nodes to bit nodes can be determined as:

$$L(r_{m \to b}) = (-1)^{|B(m)|} \prod_{b' \in B(m) \setminus b} sgn(L(q_{b' \to m})) \Phi^{-1}\left(\sum_{b' \in B(m) \setminus b} \Phi(|L(q_{b' \to m})|)\right)$$

where function $\Phi(x)$ is defined as $$\Phi(x) = -\log\left(\tanh\left(\frac{x}{2}\right)\right) = -\log\frac{e^x - 1}{e^x + 1}$$

for x>0, which can be evaluated by a table look-up method.

Figure 8:
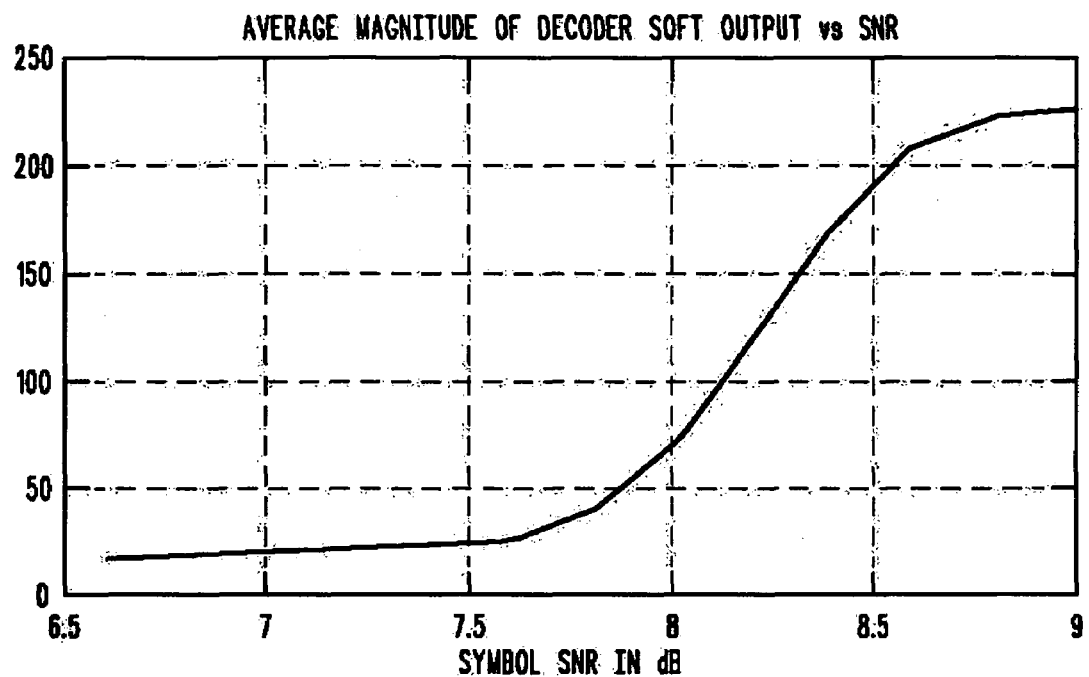
FIGS. 8-9 illustrate by way of example the relationship between BER (Bit Error Rate) and soft decision magnitude according to an embodiment of the present invention.
Figure 9:
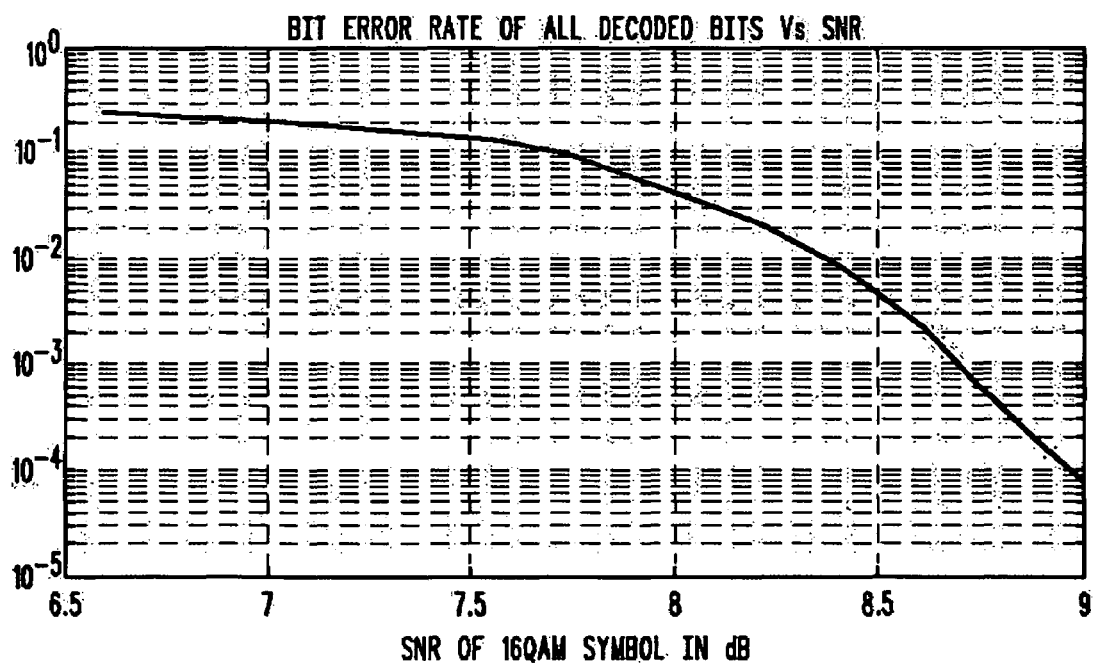

It should be noted that the value of threshold M can affect decoder performance. If M is too small, extra error propagation can be introduced during the LLR update based on the decoder feedback. On the other hand, if M is too large, the benefit of the LLR update in step 218 is limited. To achieve optimum performance, M can be adapted during the iterative decoding procedure. A proposed method for determining M can be based on the average magnitude of the LDPC decoder soft output. In general, the larger the average soft decision magnitude is the lower the bit error rate (BER) will be. FIGS. 8 and 9 illustrate an example of the relationship between BER and soft decision magnitude according to an embodiment of the present invention. From these illustrations, M can be updated as $$M = \beta \frac{1}{N} \sum_{i=1}^{N} |\tilde{b}_i|,$$

where $\tilde{b}_i$ is the $i^{th}$ soft bit and N is a number of coded bits per LDPC decoder code word. $\beta \in (0, 1)$ is a parameter to control usage of the feedback information provided to the LDPC decoder.

For illustration purposes, simulations were performed using 16QAM and an LDPC code with a 4/5 rate to compare the BER for a prior art LDPC decoder (herein referred to as the old LDPC decoder) versus the BER of an LDPC decoder operating according to method 200 (herein referred to as the new LDPC decoder). The results of the simulation are demonstrated in a plot shown in FIG. 10. According to this plot, approximately a 0.3 dB improvement is observed indicating the new LDPC decoder operates efficiently.

Figure 10:
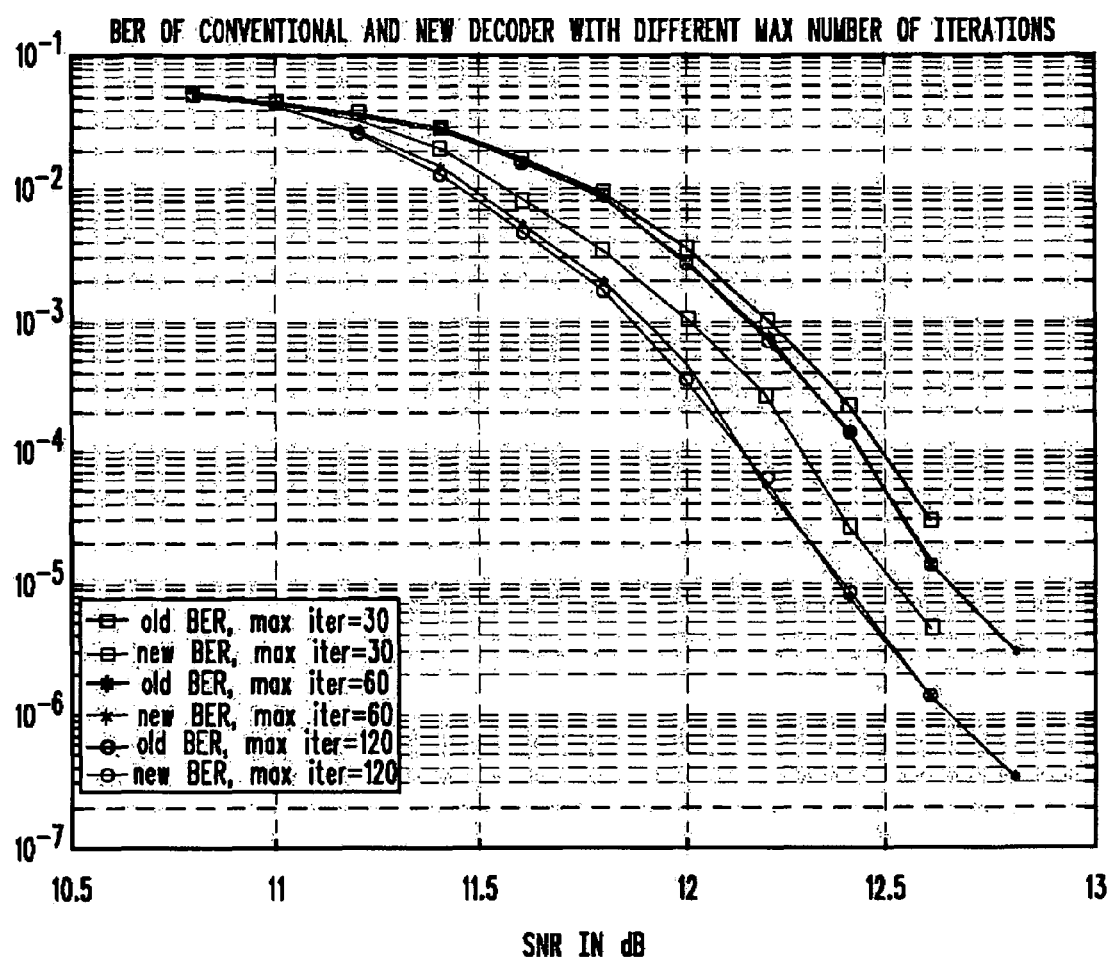
FIG. 10 compares the performance of the prior art LDPC decoder to an embodiment of the LDPC decoder according to the present invention for a variety maximum loop iterations.

It is well known in the art that the performance of an LDPC decoder depends on the maximum number of iterations. The more iterations, the better the expected performance. FIG. 10 also shows the performance of the old LDPC decoder and the new LDPC decoder using different numbers for maximum iterations (30, 60 and 120) according to an embodiment of the present invention. When the maximum number of iterations is set to 30, the new decoder outperforms the old decoder about 0.2 dB. Going from 30 to 60, the gain for old decoder is 0.05 dB while the new decoder has 0.1 dB. At higher limits the number of iterations virtually has no impact. Thus, the new decoder can achieve ~0.3 dB gain when the maximum number of iterations is set to 60.

Figure 11:
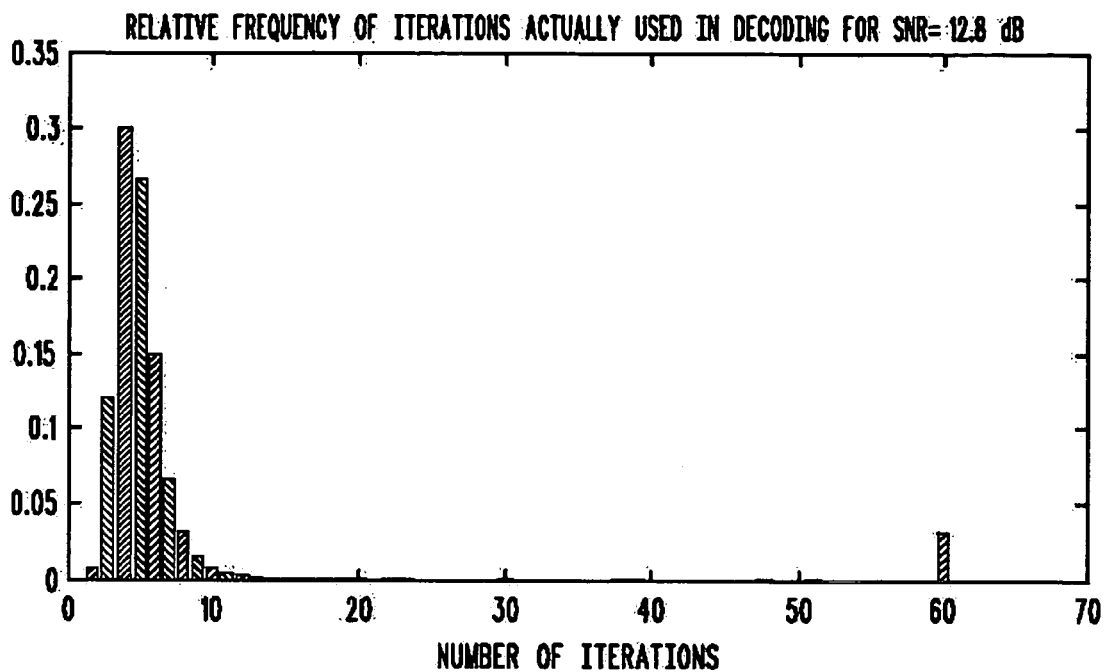
FIG. 11 illustrates the relationship between maximum loop iterations and decoding complexity according to an embodiment of the present invention.

It should be noted that when the maximum number of iterations goes from 30 to 60, the increase does not double the decoding complexity. For example, as shown in FIG. 11, when the maximum number of iterations goes from 30 to 60, about 2.9% of the LDPC code blocks undergo 60 iterations while 2.95% of the code blocks need 30 iterations. This translates to only a 0.05% complexity increase. Extra computations are needed for updating LLR bits in the case of the new LDPC decoder, however, this additional processing is relatively small compared with the decoding complexity.

Figure 12:
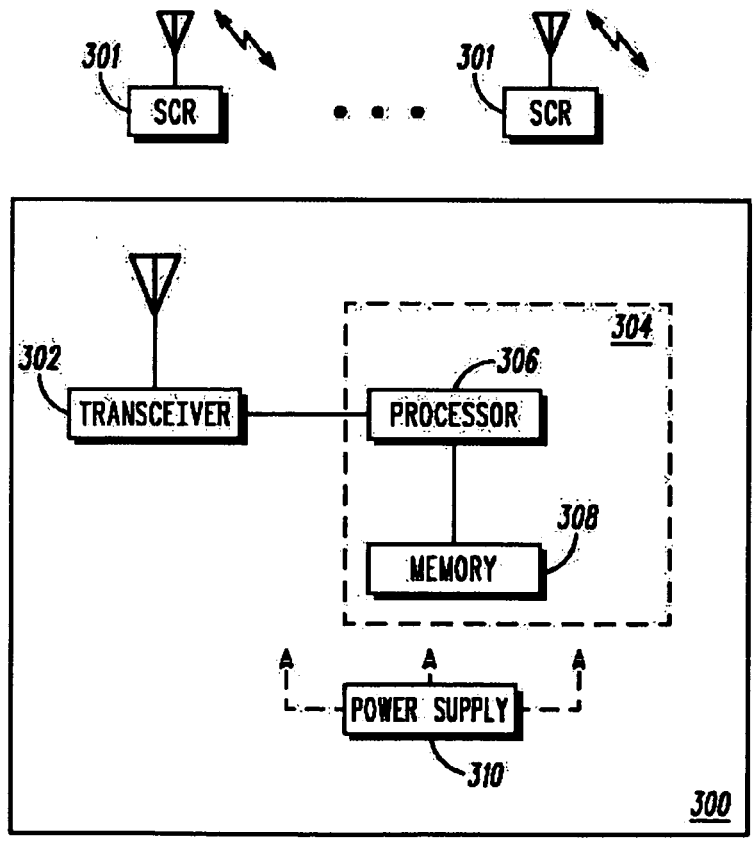
FIG. 12 is a block diagram of a base station utilizing an LDPC decoder according to an embodiment of the present invention.

It would be apparent to an artisan with ordinary skill in the art that the present invention can be used in many applications. For instance, the present invention can be applied to a base station 300 as shown in FIG. 12 that incorporates the functions of an LDPC decoder operating according to claims described below for the purpose of intercepting messages from selective call radios (SCRs) 301 according to an embodiment of the present invention. The SCRs 301 can represent, for example, conventional cell phones radiating signals to the base station 300. The base station 300 comprises a conventional transceiver 302 for exchanging over-the-air messages with the SCRs 301. Signals intercepted by the transceiver 302 are processed by the combination of processor 306 and associated memory 308 according to the present invention.

The processor 306 can utilize a combination of computing devices such as a microprocessor and/or digital signal processor (DSP), or an ASIC (Application Specific Integrated Circuit) designed to perform the operations of the present invention. The memory 308 can utilize any conventional storage media such as RAM, SRAM, Flash, and/or conventional hard disk drives. A utility company can source the power supply 310, and/or represent a battery powered uninterrupted power source for supplying power to the components of the base station 300. In this embodiment, the functions of the new LDPC decoder described by way of example as method 200 of FIG. 7 can be incorporated in part into the processor 306 and its associated memory 308 as an integrated component 304. The functions of the integrated LDPC decoder helps to significantly improve the performance of the base station 300 in decoding messages intercepted from the SCRs. 301.

It should be evident to an artisan with skill in the art that portions of embodiments of the present invention can be embedded in a computer program product, which comprises features enabling the implementation stated above. A computer program in the present context means any expression, in any language, code or notation, of a set of instructions intended to cause a system having an information processing capability to perform a particular function either directly or after either or both of the following: a) conversion to another language, code or notation; b) reproduction in a different material form.

It should also be evident that the present invention can be realized in hardware, software, or combinations thereof. Additionally, the present invention can be embedded in a computer program, which comprises all the features enabling the implementation of the methods described herein, and which enables said devices to carry out these methods. A computer program in the present context means any expression, in any language, code or notation, of a set of instructions intended to cause a system having an information processing capability to perform a particular function either directly or after either or both of the following: a) conversion to another language, code or notation; b) reproduction in a different material form. Additionally, a computer program can be implemented in hardware as a state machine without conventional machine code as is typically used by CISC (Complex Instruction Set Computers) and RISC (Reduced Instruction Set Computers) processors.

The present invention may also be used in many arrangements. Thus, although the description is made for particular arrangements and methods, the intent and concept of the invention is suitable and applicable to other arrangements and applications not described herein. The embodiments of method 300 therefore can in numerous ways be modified with additions thereto without departing from the spirit and scope of the invention.

Accordingly, the described embodiments ought to be construed to be merely illustrative of some of the more prominent features and applications of the invention. It should also be understood that the claims are intended to cover the structures described herein as performing the recited function and not only structural equivalents. Therefore, equivalent structures that read on the description are to be construed to be inclusive of the scope of the invention as defined in the following claims. Thus, reference should be made to the following claims, rather than to the foregoing specification, as indicating the scope of the invention.

What is claimed is:

1. A low-density parity-check (LDPC) decoder, comprising:
   a memory; and
   a processor programmed to:
   initialize the LDPC decoder;
   calculate a probability for each check node;
   calculate a probability for each bit node;
   calculate soft decisions;
   update the bit nodes according to the calculated soft decisions;
   calculate values from the calculated soft decisions;
   perform a parity check on the calculated values;
   update log-likelihood ratios (LLRs) if a bit error is detected in the calculated values;
   update the bit nodes according to the updated LLRs; and
   repeat the foregoing post initialization steps.

2. The LDPC decoder of claim 1, wherein the initialization step the processor is programmed to:
   initialize a plurality of bit nodes with log-likelihood ratios (LLRs);
   initialize a plurality of check nodes to a predetermined setting;
   associate each bit node to one or more corresponding check nodes; and
   associate each check node to one or more corresponding bit nodes.

3. The LDPC decoder of claim 1, wherein the processor is programmed to update the LLRs according to initial and intermediate LLRs adjusted by first and second factors.

4. The LDPC decoder of claim 1, wherein the processor is programmed to:
   repeat the foregoing post initialization steps if a bit error is detected and the number of iterations of said steps is less than a first preset value; and
   update the LLRs and the bit nodes according to the updated LLRs, and repeat the foregoing post initialization steps if a bit error is detected and the number of iterations of said steps is greater than or equal to the first preset value.

5. The LDPC decoder of claim 4, wherein the processor is programmed to cease further processing if a bit error is detected and the number of iterations exceeds a second preset value, the second preset value being greater than the first preset value.

6. The LDPC decoder of claim 1, wherein the value is a ternary value, and wherein the processor is programmed to:
   set the ternary value to one when the soft decision is greater than or equal to a threshold (M);
   set the ternary value to negative one when the soft decision is less than negative M; and
   set the ternary value to zero when the soft decision is less than M and greater negative M.

7. The LDPC decoder of claim 6, wherein the processor is programmed to adaptively determine M as a scaled average magnitude of intermediate soft decisions.

8. The LDPC decoder of claim 6, wherein the processor is programmed to reduce by $2^N$ a size of a set over which a distance minimization is calculated to update a portion of the LLRs if N of the ternary values associated with a symbol other than the LLRs under consideration have a non-zero value.

9. The LDPC decoder of claim 6, wherein the processor is programmed to update a portion of the LLRs by subtraction without distance minimization if all the ternary values have a non-zero value.

10. The LDPC decoder of claim 6, wherein the processor is programmed to apply a full size of a set over which a distance minimization is calculated to update a portion of the LLRs if all of the ternary values are zero.

11. A computer-readable storage medium, comprising computer instructions for:
    initializing a plurality of bit nodes with log-likelihood ratios (LLRs);
    initializing a plurality of check nodes to a predetermined setting;
    associating each bit node to one or more corresponding check nodes;
    associating each check node to one or more corresponding bit nodes;
    calculating a probability for each check node;
    calculating a probability for each bit node;
    calculating soft decisions;
    updating the bit nodes according to the calculated soft decisions;
    calculating values according to a sign of the calculated soft decisions;
    performing a parity check on the calculated values;
    updating the LLRs according to initial and intermediate LLRs adjusted by first and second factors if a bit error is detected in the calculated values;
    updating the bit nodes according to the updated LLRs; and
    repeating the foregoing post initialization steps.

12. The storage medium of claim 11, comprising computer instructions for:
    repeating the foregoing post initialization steps if a bit error is detected and the number of iterations of said steps is less than a first preset value; and
    updating the LLRs and the bit nodes according to the updated LLRs, and repeating the foregoing post initialization steps if a bit error is detected and the number of iterations of said steps is greater than or equal to the first preset value.

13. The storage medium of claim 12, comprising computer instructions for ceasing further processing if a bit error is detected and the number of iterations exceeds a second preset value, the second preset value being greater than the first preset value.

14. The storage medium of claim 11, wherein the value is a ternary value, and wherein the storage medium comprises computer instructions for:
- setting the ternary value to one when the soft decision is greater than or equal to a threshold (M);
- setting the ternary value to negative one when the soft decision is less than negative M;
- setting the ternary value to zero when the soft decision is less than M and greater negative M; and
- adaptively determine M as a scaled average magnitude of intermediate soft decisions.

15. The storage medium of claim 14, comprising computer instructions for:
- reducing by $2^N$ a size of a set over which a distance minimization is calculated to update a portion of the LLRs if N of the ternary values associated with a symbol other than the LLRs under consideration has a non-zero value;
- updating a portion of the LLRs by subtraction without distance minimization if all the ternary values have a non-zero value; and
- applying a full size of a set over which a distance minimization is calculated to update a portion of the LLRs if all of the ternary values are zero.

16. A base station, comprising:
- a transceiver;
- a memory; and
- a processor programmed to:
- intercept messages from a selective call radio; and
- decode said messages by:
- initializing a plurality of bit nodes with log-likelihood ratios (LLRs);
- initializing a plurality of check nodes to a predetermined setting;
- associating each bit node to one or more corresponding check nodes;
- associating each check node to one or more corresponding bit nodes;
- calculating a probability for each check node;
- calculating a probability for each bit node;
- calculating soft decisions according to corresponding check nodes and previous soft decisions of the bit nodes;
- updating the bit nodes according to the calculated soft decisions;
- calculating values according to a sign of the calculated soft decisions;
- performing a parity check on the calculated values;
- updating the LLRs if a bit error is detected in the calculated values;
- updating the bit nodes according to the updated LLRs; and
- repeating the foregoing post initialization steps.

17. The base station of claim 16, wherein the processor is programmed to update the LLRs according to initial and intermediate LLRs adjusted by first and second factors.

18. The base station of claim 16, wherein the processor is programmed to:
- repeat the foregoing post initialization steps if a bit error is detected and the number of iterations of said steps is less than a first preset value;
- update the LLRs and the bit nodes according to the updated LLRs, and repeat the foregoing post initialization steps if a bit error is detected and the number of iterations of said steps is greater than or equal to the first preset value; and
- cease further processing if a bit error is detected and the number of iterations exceeds a second preset value, the second preset value being greater than the first preset value.

19. The base station of claim 16, wherein the value is a ternary value, and wherein the processor is programmed to:
- set the ternary value to one when the soft decision is greater than or equal to a threshold (M);
- set the ternary value to negative one when the soft decision is less than negative M;
- set the ternary value to zero when the soft decision is less than M and greater negative M; and
- adaptively determine M as a scaled average magnitude of intermediate soft decisions.

20. The base station of claim 19, wherein the processor is programmed to:
- reducing by $2^N$ a size of a set over which a distance minimization is calculated to update a portion of the LLRs if N of the ternary bits associated with a symbol other than the LLRs under consideration has a non-zero value;
- update a portion of the LLRs by subtraction without distance minimization if all the ternary values have a non-zero value;
- apply a full size of a set over which a distance minimization is calculated to update a portion of the LLRs if all of the ternary values are zero.

* * * * *